United States Patent [19]

Auchterlonie

[11] Patent Number: 4,893,078

[45] Date of Patent: Jan. 9, 1990

[54] ABSOLUTE POSITION SENSING USING SETS OF WINDINGS OF DIFFERENT PITCHES PROVIDING RESPECTIVE INDICATIONS OF PHASE PROPORTIONAL TO DISPLACEMENT

[76] Inventor: Richard C. Auchterlonie, 5701 N. Sheridan #29-q, Chicago, Ill. 60660

[21] Appl. No.: 55,422

[22] Filed: May 28, 1987

[51] Int. Cl.⁴ .................. G01B 7/14; G08C 19/06; H01F 21/02; H02K 24/00
[52] U.S. Cl. ..................... 324/208; 318/660; 336/45; 336/115; 336/129; 336/136; 340/870.32
[58] Field of Search ............... 324/207, 208; 336/45, 336/115, 121–123, 129, 130, 136, 45; 318/657–661; 340/870.31, 870.32, 870.33, 870.35, 870.36; 341/15

[56] References Cited

U.S. PATENT DOCUMENTS

| | | | |
|---|---|---|---|
| 2,650,352 | 8/1953 | Childs | 336/123 |
| 2,671,892 | 3/1954 | Childs | 340/195 |
| 2,740,935 | 4/1956 | Statsinger | 323/48 |
| 2,769,969 | 11/1956 | Comstock | 340/196 |
| 2,799,835 | 7/1957 | Tripp et al. | 336/123 |
| 2,867,783 | 1/1959 | Childs | 336/123 |
| 2,911,632 | 11/1959 | Levine et al. | 340/195 |
| 2,915,722 | 12/1959 | Foster | 336/115 |
| 2,924,798 | 2/1960 | Foster | 336/115 |
| 2,988,697 | 6/1961 | Hirsch | 324/86 |
| 3,011,119 | 11/1961 | Starks-Field et al. | 323/53 |
| 3,064,218 | 11/1962 | Farrand | 336/129 |
| 3,090,934 | 5/1963 | Farrand | 336/129 |
| 3,138,772 | 6/1964 | Persons, Jr. | 336/136 |
| 3,202,948 | 8/1965 | Farrand | 336/115 |
| 3,281,655 | 10/1966 | Blasingame | 323/51 |
| 3,441,888 | 4/1969 | Farrand | 336/129 X |
| 3,493,955 | 3/1965 | Minasy | 340/280 |
| 3,641,467 | 2/1972 | Ringland et al. | 336/5 |
| 3,673,584 | 6/1972 | Farrand | 324/208 X |
| 4,005,396 | 1/1977 | Fujiwara et al. | 340/870.32 |
| 4,134,065 | 1/1979 | Bauer et al. | 324/208 |
| 4,282,485 | 8/1981 | Pauwels et al. | 324/208 |
| 4,504,832 | 3/1985 | Conte | 340/870.32 X |
| 4,604,575 | 8/1986 | Shimizu et al. | 324/208 |
| 4,634,950 | 1/1987 | Klatt | 318/732 |
| 4,644,355 | 2/1987 | Russell | 340/870.36 |

FOREIGN PATENT DOCUMENTS

| | | | |
|---|---|---|---|
| 0026204 | 2/1983 | Japan | 324/208 |
| 0817738 | 3/1981 | U.S.S.R. | 324/208 |
| 0817893 | 3/1981 | U.S.S.R. | 324/208 |
| 848985 | 7/1981 | U.S.S.R. | 324/208 |
| 0868327 | 9/1981 | U.S.S.R. | 324/208 |

OTHER PUBLICATIONS

N. C. Gray, "Simplifying LVDT Signal Conditioning", Machine Design, May 7, 1987, pp. 103–106.
R. Zimmerman, "Resolvers as Velocity and Position Encoding Devices," PCIM, Sep. 1986, pp. 47–50, 52, 54.
D. Overcash, "Selecting the Proper Position Sensor," Control Engineering, Sep. 1986, pp. 294–302.
"LVDT and RVDT Linear and Angular Displacement Transducers," Tech. Bulletins 1002D, 2M 9/85 PIP, 1101, MP-5M-5/85, 13 pages.

Primary Examiner—Gerald R. Strecker
Attorney, Agent, or Firm—Richard Auchterlonie

[57] ABSTRACT

For enabling a resolver to have absolute position sensing over a wide displacement range while still obtaining the resolution, accuracy and precision obtainable by operation in an incremental mode, the resolver is provided with a number of terminals for providing offset pitch phase indications as a function of position. A microcomputer is programmed to execute a decoding procedure for reading the offset pitch phase indications and from them computing the absolute position. This method is applicable to linear as well as rotary position sensing. By using multiplexing, digital signal processing and large-scale circuit integration of interfacing the resolver to the microcomputer, the method can achieve absolute position sensing with high reliability and low cost. The offset pitch phase indications are readily provided by inductive coupling between a multiplicity of windings, including a set of offset pitch windings connected to the terminals.

17 Claims, 7 Drawing Sheets

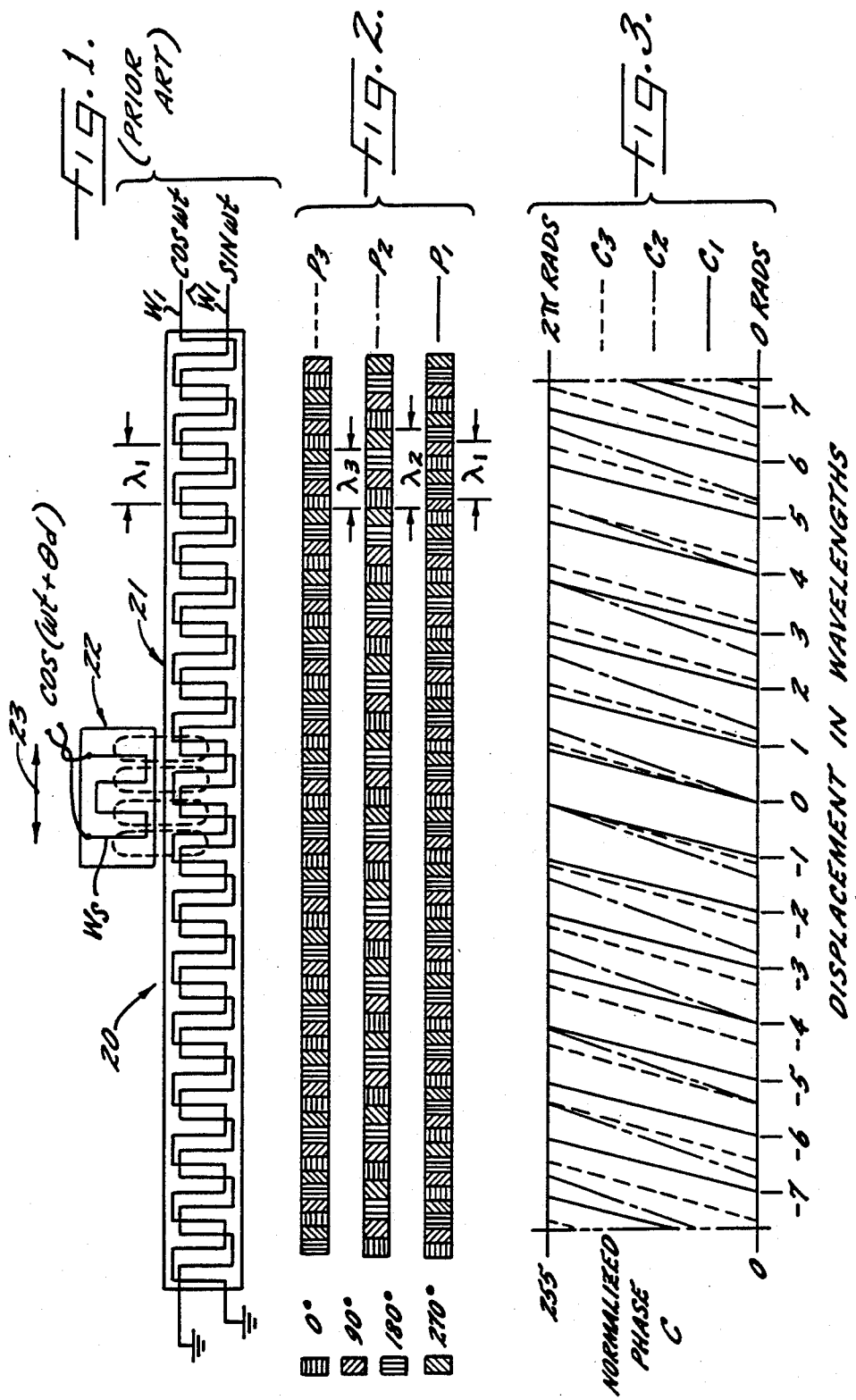

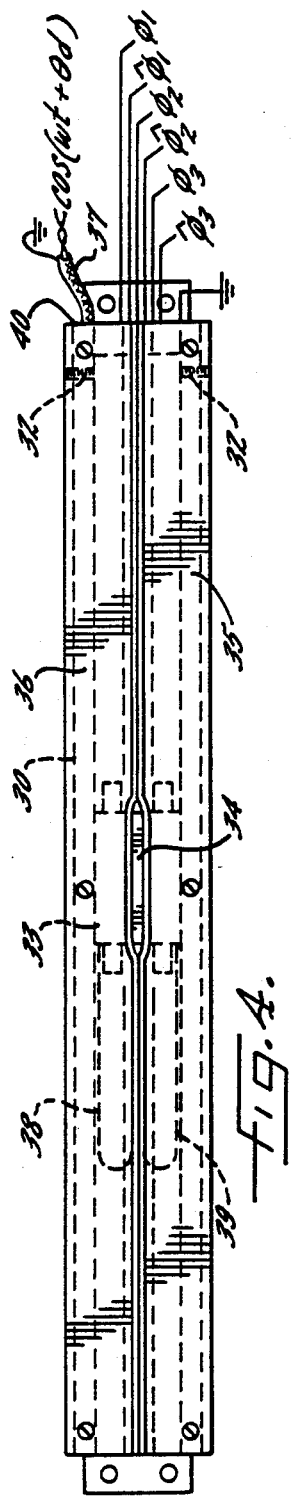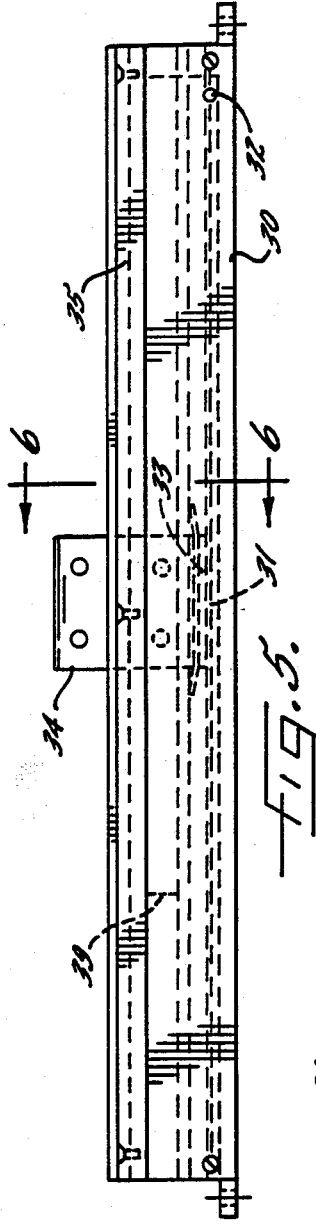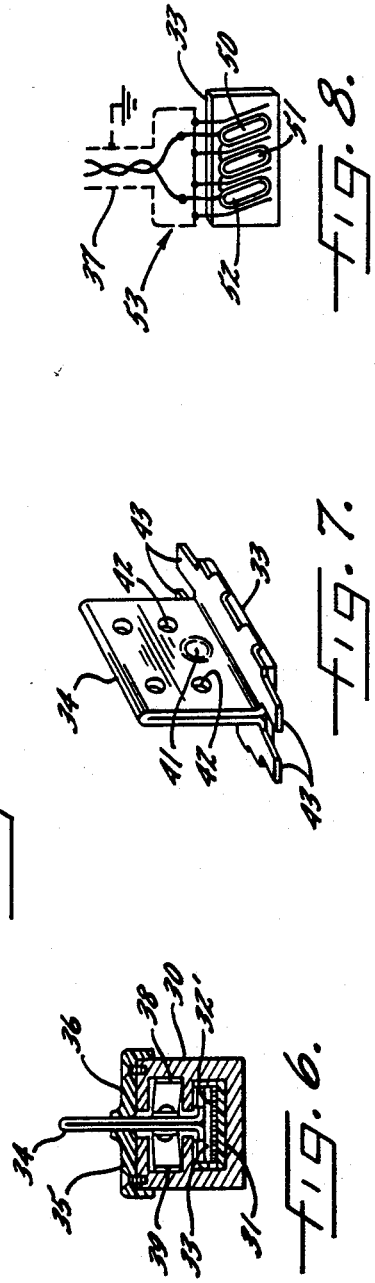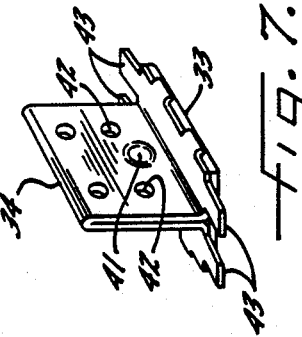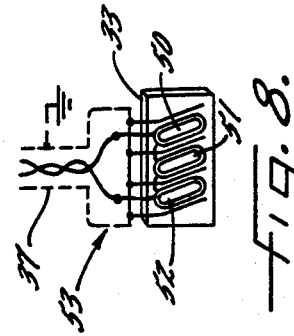

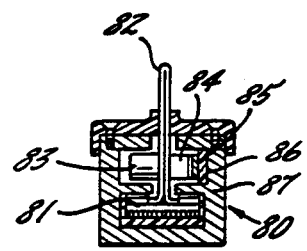
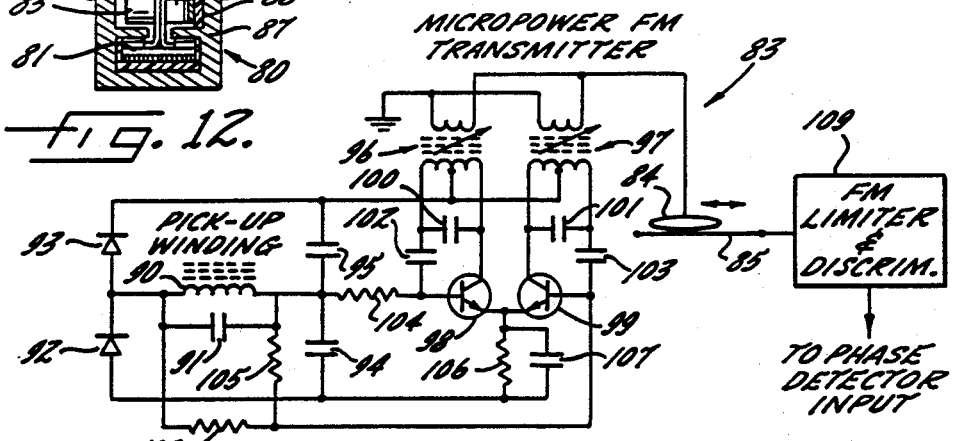
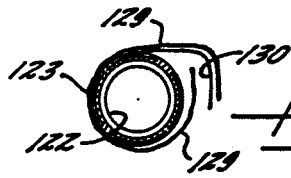
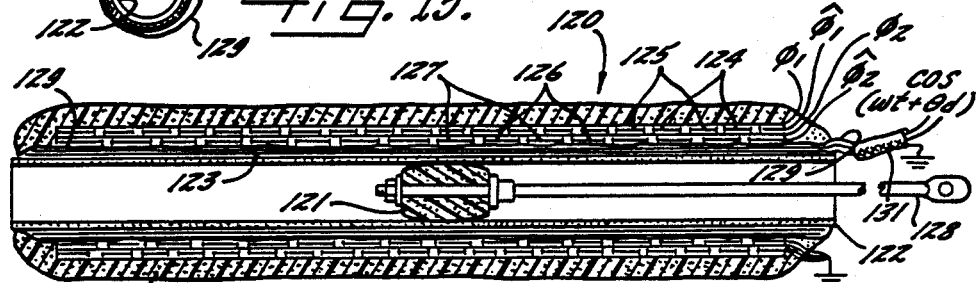
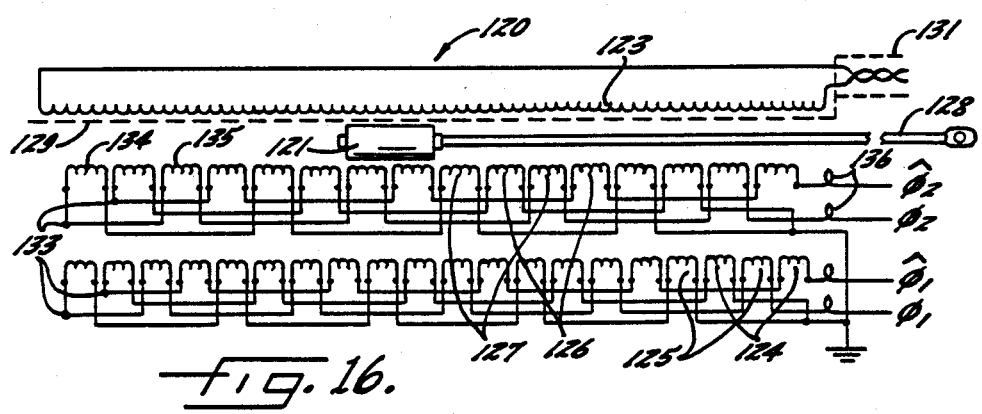

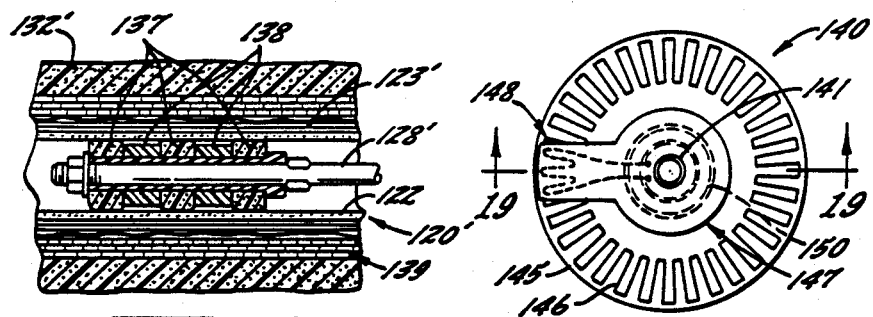
Fig. 17.
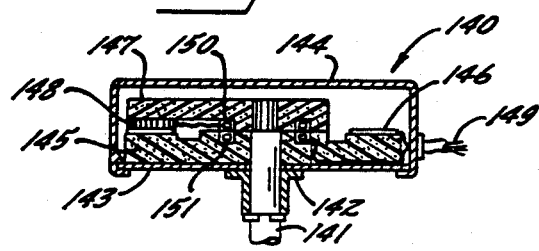
Fig. 18.
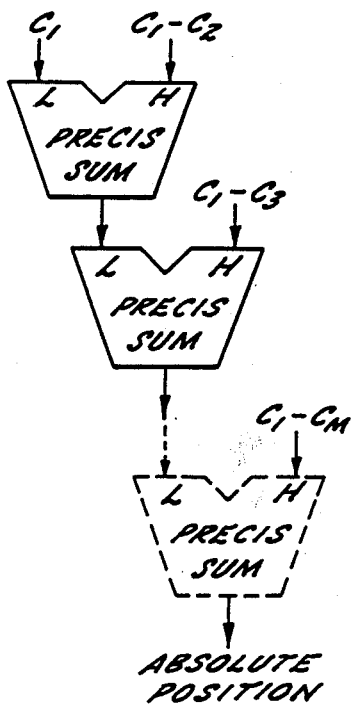
Fig. 20.
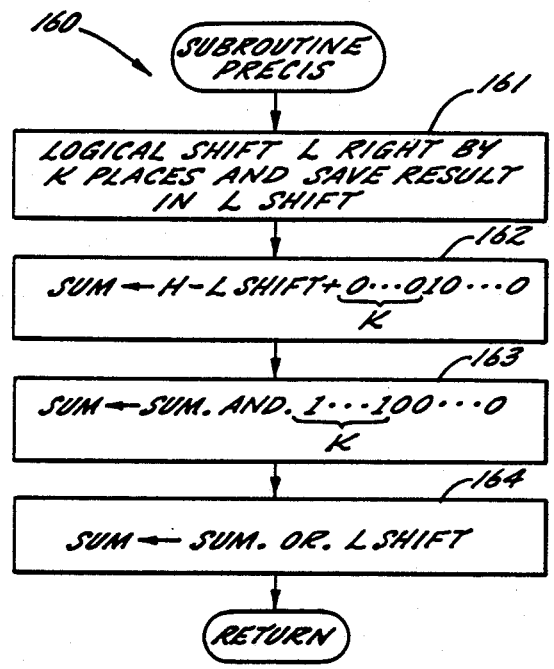
Fig. 19.
Fig. 21.

ABSOLUTE POSITION SENSING USING SETS OF WINDINGS OF DIFFERENT PITCHES PROVIDING RESPECTIVE INDICATIONS OF PHASE PROPORTIONAL TO DISPLACEMENT

BACKGROUND OF THE INVENTION

1. Field of the Invention.

The present invention relates to position sensors in which displacement is indicated by the phase of an electrical signal.

2. Description of the Background Art.

The shaft angle transducer is a fundamental component in modern control technology. By employing a mechanical coupling mechanism such as a rack and pinion or a spooled band, a shaft angle transducer can monitor linear as well as angular displacement. Linear displacement, however, can also be measured directly by differential or linear variable phase transformers, and ferromagnetic position transducers. See, e.g., Rhod Zimmerman, "Resolvers As Velocity and Position Encoding Devices," *PCMI*, Sept. 1986, pp. 47–54; Don Overcash, "Selecting the Proper Position Sensor," *Control Engineering*, Sept. 1986, pp. 294–302.

Differential or linear variable phase transformers offer many advantages such as infinite resolution, ruggedness, input/output isolation, and operation over wide temperature ranges. A kind of variable phase transformer sold under the trademark "Inductosyn" is also capable of very high accuracy. As described in Tripp et al. U.S. Pat. No. 2,799,835, this kind of variable phase transformer includes two relatively moveable inductor supports. A first one of the supports carries a pair of first and second windings each in the form of a flat metallic ribbon following a sinuous path along the direction of relative displacement between the two supports. The first and second windings are mounted in positional phase quadrature relation with respect to each other and are excited in electrical phase quadrature by respective sine and cosine signals. The second support carries a third winding similar to the first and second windings. The third winding is also aligned along the direction of relative displacement and is positioned for mutual coupling with the first and second windings. Therefore, the third winding provides an electrical signal having a phase indicating the relative displacement between the supports.

The "Inductosyn," however, must be used as an incremental device for sensing displacements in excess of the wavelength of the windings, because a relative displacement of one wavelength between the two supports results in the same phase indication. For some other kinds of position sensing variable phase transformers, attempts have been made to obtain accurate absolute position sensing over a relatively wide range. Pauwels et al. U.S. Pat. No. 4,282,485, for example, discloses a linear variable phase transformer employing multi-layer helical coils in which the sine and cosine driven windings have a density of windings which is a sinusoidal function of position along the length of the transformer. Shimizu et al. U.S. Pat. No. 4,604,575 discloses a rotational position detection system including a first rotary variable phase transformer detecting an absolute rotational position within a complete circumference, a second rotary variable phase transformer detecting absolute rotational position within an integral submultiple of a complete circumference, and means for combining the positions detected by the two transformers to obtain an indication of absolute rotational position.

SUMMARY OF THE INVENTION

Accordingly, the primary object of the present invention is to provide an absolute position sensor which indicates displacement over a wide range while obtaining the accuracy of an incremental position sensor.

A specific object of the present invention is to provide an "Inducfosyn" type of variable phase transformer with absolute position sensing along its entire length.

Another object of the invention is to provide a low-cost absolute position sensor of high accuracy for use in a microcomputer system.

BRIEF DESCRIPTION OF THE DRAWINGS

Other objects and advantages of the invention will become apparent upon reading the following detailed description and upon reference to the drawings in which:

FIG. 1, labeled "PRIOR ART," is a diagram showing the three windings in a linear "Inductosyn" type of variable phase transformer;

FIG. 2 is a diagram showing offset pitch phase patterns used in a linear position sensor according to the present invention;

FIG. 3 is a graph showing the phase as a function of displacement sensed from each of the three phase patterns of FIG. 1;

FIG. 4 is a plan view of a linear position sensor employing the present invention;

FIG. 5 is a side view of the position sensor of FIG. 4;

FIG. 6 is an end view in section along line 6—6 in FIG. 5;

FIG. 7 shows the slider used in the position sensor of FIGS. 4–6;

FIG. 8 is an underside view of pick-up coils in the slider of FIG. 7;

FIG. 12 is a side view corresponding to FIG. 6 but showing a strip transmission line rather than a flexed resilient ribbon returning the phase signal from the pick-up head;

FIG. 13 is a schematic diagram of a micropower frequency-shift-keyed transmitter for generating a return signal for transmission over the strip transmission line of FIG. 12;

FIG. 14 is a longitudinal cross-sectional view of an alternative embodiment of a linear position sensor of the present invention employing helical windings;

FIG. 15 is an axial view of the position sensor of FIG. 14 during assembly of an electrostatic shield between the driven windings and the pick-up winding;

FIG. 16 is a schematic diagram of the linear position sensor of FIG. 14;

FIG. 17 is a longitudinal cross-sectional view corresponding to FIG. 14 but showing a ferromagnetic coupling member including a plurality of ferromagnetic rings offset from each other by about one wavelength;

FIG. 18 is a plan view of an angular position sensor employing the present invention;

FIG. 19 is a side view, in cross section along line 19—19 in FIG. 18, of the angular position sensor mounted in a protective housing;

FIG. 20 is a flow diagram of a computer procedure which combines phase signals from offset pitch phase patterns to determine absolute position;

FIG. 21 is a flowchart of a subroutine used in the procedure of FIG. 20 to justify a lower-order set of binary bits with a higher-order set of binary bits and then combine them to form a binary number indicating position;

Figure 9:
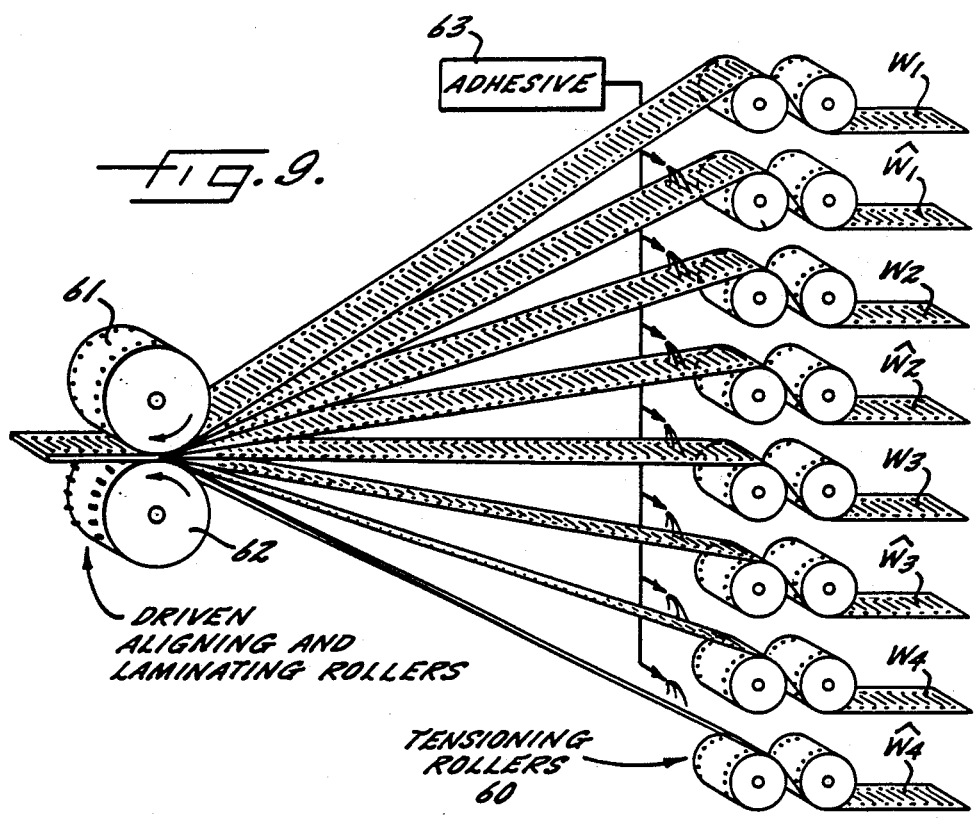
FIG. 9 is a diagram showing a process for laminating together a multiplicity of offset pitch flat sinuous windings in phase registration with each other.

While the invention is susceptible to various modifications and alternative forms, specific embodiments thereof have been shown by way of example and will be further described in detail. It should be understood, however, that it is not intended to limit the invention to the particular forms disclosed, but, on the contary, the intention is to cover all modifications, equivalents, and alternatives falling within the spirit and scope of the invention as defined by the appended claims.

DESCRIPTION OF THE PREFERRED EMBODIMENTS

Turning now to the drawings, there is shown in FIG. 1 a schematic diagram of an "Inductosyn" type of variable phase transformer 20 for sensing linear displacement. The variable phase transformer 20 includes a first inductor support 21 and a second inductor support 22 which are moveable relative to each other along an axial direction 23. The first support 21 carries a pair of windings $W_1$ and $\hat{W}_1$ each in the form of a flat metallic ribbon following a sinuous path along the axial direction 23. The windings $W_1$ and $\hat{W}_1$ are mounted in positional phase quadrature relation with respect to each other and are driven by respective cosine and sine signals. (Sometimes, however, these kind of resolvers use three-phase driven windings instead of two-phase driven windings.) The second support 22 carries a third winding $W_s$ similar to the first and second windings $W_1$ and $\hat{W}_1$. The third winding is also aligned along the axial direction and is positioned for mutual coupling with the first and second windings. Therefore, the third winding $W_s$ provides an electrical signal having a phase $\theta_d$ indicating the relative displacement between the two supports 21, 22. The electrical signal from the third winding, however, only gives an incremental indication of displacements between the two supports in excess of one wavelength $\lambda$, of the windings, because a relative displacement of one wavelength between the two supports results in the same phase indication.

In other words, for the variable-phase transformer 20, the first and second windings $W_1$ and $\hat{W}_1$ comprise a set or pair of windings, each winding in the set being disposed in a periodic spatial pattern having the same pitch or wavelength $\lambda_1$ and extending over a distance or range including multiple cycles. When used in connection with the third winding $W_s$, the windings $W_1$ and $\hat{W}_1$ permit an electrical signal $\cos(wt+\theta_d)$ to be generated having a phase $\theta_d$ proportional to the relative displacement between the two supports 21, 22. The phase $\theta_d$ itself is a periodic function of the relative displacement over a range of displacement corresponding to the distance or range over which the set or pair of periodic windings $W_1$ and $\hat{W}_1$ extend. In particular, the phase $\theta_d$ as a function of the relative displacement varies continuously over a range of at least two pi ($2\pi$) radians and is periodic with the same wavelength $\lambda_1$ as the first and second windings $W_1$ and $\hat{W}_1$. The set or pair of periodic windings can therefore be considered as defining a phase pattern ($P_1$ in FIG. 2) giving rise to a phase $\theta_d$ that is a corresponding periodic function of the relative displacement between the two supports 21, 22.

In accordance with an important aspect of the present invention, the phase ambiguity of the "Inductosyn" type of position sensor is resolved by providing additional sets of periodic windings, each set of windings defining a respective offset pitch pattern (for example patterns $P_2$ and $P_3$ in FIG. 2) having a different respective pitch or wavelength (for example $\lambda_2$ or $\lambda_3$ in FIG. 2). If the support 21 is longer than the support 22, the respective offset pitch phase patterns are most easily established by placing additional pairs of driven windings on the support 21, with each pair of driven windings being similar to the windings $W_1$ and $\hat{W}_1$ but having a different pitch or wavelength. Alternatively, if the support 21 is shorter than the support 22, the offset pitch phase patterns are most easily established by providing multiple pick-up windings on the support 22, with each pickup winding having a different pitch or wavelength. The alternative method requires fewer windings, but in such a case the pick-up windings extend over a greater distance and are therefore more susceptible to noise pick-up. Consequently, for most applications, it is preferable to use a support 22 that is smaller than the support 21 as shown in FIG. 1, and to practice the present invention by providing multiple pairs of driven windings on the support 21.

Turning now to FIG. 2, there is shown a schematic diagram of three phase patterns $P_1$, $P_2$, and $P_3$ each having multiple wavelengths. As introduced above, each phase pattern can be provided by a respective pair of driven windings driven by sine and cosine signals for the case in which multiple pairs of driven windings are used, or alternatively each phase pattern can be provided by a respective pick-up winding for the case in which multiple pick-up windings are used. In FIG. 2 the second wavelength $\lambda_2$ is 4/3 of first wavelength $\lambda_1$ and the third wavelength $\lambda_3$ is 16/15 of first wavelength $\lambda_1$.

In accordance with an important aspect of the present invention, the phase patterns have respective wavelengths which are about the same but are offset from each other, preferably according to:

$$N_1 |\lambda_2 - \lambda_1| = \lambda_1$$

$$N_2 N_1 |\lambda_3 - \lambda_1| = \lambda_1$$

$$\vdots$$

$$N_{M-1} \ldots N_2 N_1 |\lambda_M - \lambda_1| = \lambda_1$$

where $N_1, N_2, \ldots, N_{(M-1)}$ are integers. These relationships readily permit the phase pattern $P_2$ to provide absolute position sensing over $N_1$ wavelengths $\lambda_1$, the phase pattern $P_3$ to provide absolute position sensing over $N_2 N_1$ wavelengths $\lambda_1$, and so on. To facilitate the use of binary arithmetic, preferably the N's are powers of two, for example, four, eight or sixteen. The phase patterns in FIG. 2 correspond to N's equal to four. As further described below, the maximum values that can be selected for the N's are determined by the precision of the phase measurements.

In accordance with another aspect of the present invention, an absolute position measurement is made by successively obtaining respective phase measurements for each of the phase patterns, and applying a decoding procedure. The respective phase measurements are obtained by operating an electronic multiplexer which selects the respective set of driven windings or the respective pick-up winding for the respective phase pattern. For using binary arithmetic in the decoding procedure, the phase measurements are preferably made so that a range of 0 to 360 degrees is represented by an unsigned binary number from 0 to one minus an integral power of two, for example, from 0 to 255 representable with eight binary bits.

Turning now to FIG. 3, there is shown a graph of the normalized value or count C obtained as a function of displacement from the null position for each of the phase patterns in FIG. 2. In order to apply a decoding procedure shown and described below in connection with FIGS. 20 and 21, the measured phase values are normalized, by subtracting predetermined constant phase offsets if necessary, to obtain a zero phase value or count C at a central null or zero position. The offsets in the pitch of the respective phase patterns is evident from the differences between the respective slopes for the phase patterns. Each phase pattern has the same phase value at a multitude of different displacement values. Each displacement value, however, has associated with it a unique set of three respective phase values for the phase patterns. Therefore, a decoding procedure can determine the absolute displacement from the three respective phase values measured for any given displacement within the displacement range in FIG. 3.

Turning now to FIGS. 4 to 6, there is shown a linear position sensor employing the present invention. The sensor is housed in an extruded aluminum rail 30. An elongated support 31 for a plurality of pairs of driven windings ($\phi_1$, $\bar{\phi}_1$, $\phi_2$, $\bar{\phi}_2$, $\phi_3$, $\bar{\phi}_3$) is secured in the bottom of the rail 30 by set screws 32. Preferably the support is an insulating material such as glass fiber reinforced plastic. For high accuracy, ferromagnetic materials are typically not used, but if high accuracy is not of prime importance, the substrate can be loaded with iron or ferrite powder to increase the magnetic coupling between the driven windings and the pick-up winding and thereby provide an increased output singal level. The driven windings 32$^1$ are laminated or wound onto the substrate 31, as shown and further described below in connection with FIGS. 9-11.

A pick-up winding is carried by a slider 33 which slides over the substrate 31. To position the slider, a control bracket 34 is fastened to the slider 33. The control bracket protrudes above the rail 30 for connection as a follower to whatever is providing the displacement to be sensed. A pair of rubber or plastic seals 35, 36 cover the top of the rail 30 and join forming an elongated slit through which the control bracket slides. In order to provide a connection between the pick-up winding in the slider 33 and a shielded twisted pair 37 mounted to the end portion 40 of the rail 30, a pair of resilient bands 38, 39 connect the control bracket 34 to the end portion 40 of the rail. The band 38 carries electrical conductors conveying the pick-up signal. Preferably the resilient bands are Mylar strips, and the electrical conductors are copper foil strips adhesively bonded or laminated into the resilient band 38.

The control bracket 34 and slider 33 are further shown in FIG. 7. Preferably the control bracket is made of sheet brass that is cut, bent to shape and spot welded together at 41. Holes 42 are provided for riviting the control bracket 34 to the resilient bands 38, 39. To urge the slider into contact with the substrate 31, resilient fingers 43 are formed in the control bracket.

Shown in FIG. 8 are pick-up coils 50, 51, 52 in the bottom of the slider 33. The slider 33 is made of plastic and can be loaded with iron or ferrite powder to increase the coupling of the pick-up coils with the driven windings. The coils are rectangular multi-turn pancake coils that are slightly skewed to improve the linearity of the phase with respect to displacement. The coils are spaced one-half wavelength from each other, and the middle coil 51 is connected in opposite polarity with respect to the end coils 50, 52. To reduce noise and distortion caused by capacitive coupling to the coils 50, 51, 52, an electrostatic shield 53 in the form of a comb is laid over the coils. The electrostatic shield is connected to the ground lead or shield wires of the electrical conductors 37 conveying the pick-up signal.

Turning now to FIG. 9, there is shown a schematic diagram of a machine for aligning and laminating multiple driven windings in precise phase registration with each other. Perforated plastic film of the kind used for motion picture film is laminated to copper foil and the windings of the required wavelengths are etched in the copper foil in the required registration with the perforations by using printed or photolithographic techniques. The films carrying the various windings are conveyed over tensioning rollers 60 to a pair of driven laminating rollers 61 and 62. The rollers are sprocketed to maintain proper registration between the film layers. Before reaching the laminating rollers, the films receive adhesive 63 for bonding the films together.

Figure 10:
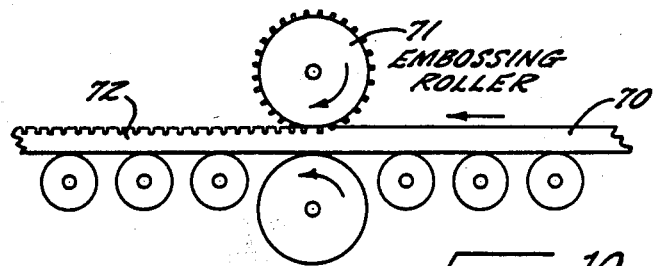
FIG. 10 is a diagram showing a ferromagnetic substrate being embossed with slots for aligning lap windings.

Driven windings can also be wound rather than laminated on the substrate. Winding by hand is facilitated by the use of a substrate having closely spaced slots for receiving the windings. As shown in FIG. 10, an embossing roller 71 can be used to emboss a plastic strip 70 to provide the slots 72. The embossing could also be done during an extrusion process. Preferably the plastic strip 70 is loaded with iron or ferrite powder to increase the coupling between the driven windings and the pick-up winding.

Figure 11:
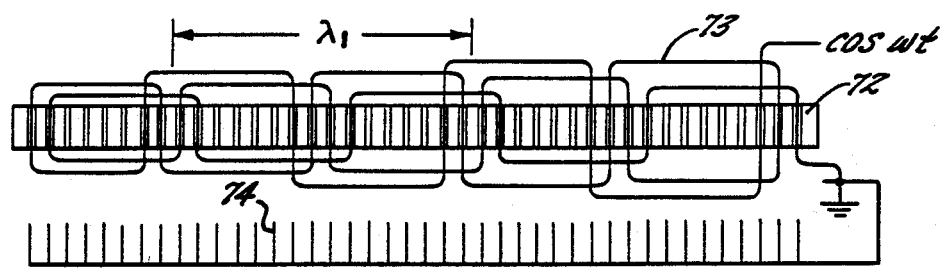
FIG. 11 is a diagram showing one lap winding on a slotted ferromagnetic substrate, and an electrostatic shield in the form of a comb.

The winding of a driven winding 73 on the slotted substrate 72 is shown in FIG. 11. The first wavelength $\lambda_1$ is chosen to have an integral number of slots, such as 16 as shown. The positions of the other windings are quantized by the positions of the slots. This quantization introduces some phase non-linearity in the response from the other windings. The phase non-linearity may necessitate the use of an additional pair of driven windings. Preferably the uppermost winding in each slot of the substrate is covered by a wire from an electrostatic shield 74 in the form of a comb.

The use of a slotted substrate comprising iron or ferrite powder considerably increases the degree of coupling between the driven windings and the pick-up winding. To eliminate the need for an electrical connection to the pick-up coil, a micropower FM transmitter could be energized solely by the signal received by the pick-up winding from the driven windings. The use of such a transmitter is shown in FIGS. 12-13.

As shown in FIG. 12, a linear position sensor 80 similar to that shown in FIGS. 4-6 is provided with a slider 81 mounted to a control bracket 82. A micro-power FM transmitter 83 and a sliding capacitor 84 are also mounted to the control bracket 82. The sliding capacitor 84 capacitively couples the output of the FM transmitter 83 to a strip transmission line comprising a plastic strip 86 mounted to the rail 87 of the position sensor 80, and a strip of copper foil 85 adhesively bonded to the plastic strip 86. The strip transmission line extends along the length of the rail 86.

A schematic diagram of the micro-power FM transmitter 83 is shown in FIG. 13. A signal at about 20 KHz is received by the pick-up coil 90 which is tuned to the frequency of the signal by a capacitor 91. The received signal is rectified by a full wave doubler circuit including a pair of germanium crystal diodes 92, 93 and a pair of capacitors 94, 95. The rectified signal powers a selected one of two transistor oscillators having respective tuned circuits 96, 97 which are adjusted to different frequencies. The transistor oscillators also include respective transistors 98, 99, resonating capacitors 100, 101, feedback capacitors 102, 103, and biasing resistors 104, 105.

So that a particular one of the transistor oscillators are selected for oscillation in response to the polarity of the signal across the pick-up coil 90, the transistors 98, 99 share a common emitter resistor 106 and RF bypass capacitor 107 so as to form a differential pair and function as a differential amplifier at the 20 KHz frequency. The signal across the pick-up coil 90 is fed to the transistor 99 through a resistor 108, causing conduction to periodically switch from one transistor to the other, and therefore causing the frequency of oscillation to periodically shift from the frequency of one transistor oscillator to the other. The frequencies of oscillation, for example, are slightly above and below the standard FM intermediate frequency of 10.7 MHz so that a standard FM limiter and discriminator 109 may be used to detect the FM modulated signal. The limiter and discriminator is, for example, an integrated circuit such as RCA Corporation part No. CA3075. The limiter and discriminator receives the signal from one end of the strip transmission line 85.

Turning now to FIG. 14, there is shown a longitudinal cross-sectional view of an alternative embodiment 120 of a linear position sensor of the present invention employing helical windings. The linear position sensor 120 has the advantage that the sense winding and the driven windings are relatively fixed with respect to each other so that flexible electrical connections or other means are not required for communicating signals from the relatively moving windings. Instead of relatively displacing the pick-up winding with respect to the driven windings to obtain a phase signal indicating displacement, a displaceable ferromagnetic core 121 magnetically couples the driven windings and the pick-up winding in such a way that the pick-up winding receives a signal having a phase indicating displacement of the core 121.

As shown in FIG. 14, the core 121 is disposed inside a tube 122 upon which are wound a two-layer pick-up winding 123 and offset pitch driven windings 124, 125, 126, and 127 for the respective phases $\phi_1$, $\bar{\phi}_1$, $\phi_2$, $\bar{\phi}_2$. For displacing the core 121, it is secured to the end of a rod 128. In order to eliminate electrostatic coupling between the pick-up winding 123 and the driven windings 124, 125, 126, 127, an electrostatic shield 129 in the form of a layer of metal foil is wound on the pick-up winding, and the driven windings are wound over the shield.

As shown in FIG. 15, the shield 129 is wound over the pick-up winding 123 with overlapping portions separated by an insulating layer 130. The shield 129, for example, is a strip of aluminum foil, and the insulating layer is a strip of adhesive tape. This form of construction permits magnetic flux at the operating frequency to pass from the driven windings to the pick-up winding, while attenuating higher frequency noise and harmonic distortion.

Returning for a moment to FIG. 14, the shield 129 is preferably connected to the shield 131 of a shielded twisted pair for conveying the signal received by the pick-up winding 123. Preferably all of the windings are magnetically shielded by an external magnetic shield 132 which also improves the coupling between the driven windings and the pick-up windings. As shown in FIG. 14, the magnetic shield is made of epoxy resin loaded with ferrite powder. The ferrite powder is mixed with epoxy glue, and the mixture is painted on the windings so that it hardens over the windings. In FIG. 14 the thickness of the windings has been exaggerated for the sake of illustration. The tube 121 as well as the windings should be thin so as to provide a short air gap between the core 121 and the shield 132 so as to maximize the magnetic coupling between the pick-up winding and the driven windings via the core. The core 121, for example, has a length of 10 mm, and a diameter of 5.4 mm. The coils are wound with 0.125 mm diameter wire, giving 8 turns per mm. The driven windings extend over 80 mm, or four wavelengths of 20 mm per wavelength. The two layer pick-up winding extends over 90 mm. With these dimensions and at an operating frequency of 15.625 kHz, the pick-up winding resonated with a 0.08 uF capacitor and therefore had an impedance of about 130 ohms.

The electrical connections for the windings of the sensor 120 are shown in FIG. 16. Each of the windings is formed of a continuous length of wire, but each of the driven windings 124, 125, 126, 127 has a number of sections that are about a quarter wavelength long. Also, adjacent quarter wave sections are wound with opposite sense. Preferably this is done by winding one half of each driven winding in a clockwise direction, and winding the other half in a counter-clockwise direction. The direction changes, for example, at the nodes 133, and the quarter wave section 134 is wound clockwise and the quarter wave section 135 is wound counter-clockwise.

If the length of the core 121 is very short in comparison to the length of the windings, there may be substantial unbalanced parasitic magnetic coupling between the driven windings and the pick-up winding. In this case it is advisable to null out the imbalance of each driven winding by winding a few additional turns 136 as needed. These additional turns are wound by hand while the respective driven winding is energized at the operating frequency and the signal in the pick-up winding is measured, in order to null out the measured signal.

For the sensor 120 of FIG. 14, the core 121 is about a half wavelength long, and the windings are about four wavelengths long. If the sensor is to be longer than this, it is advisable to use a segmented core having a number of magnetically permeable half-wavelength sections centered at wavelength intervals, as shown in FIG. 17. In the sensor 120', the core 121' includes three ferromagnetic sections 137 separated by half-wavelengths spacers 138. The sensor 120' has a two-layer pick-up winding and driven windings 139 for six phases. It should be noted that the thickness of the windings in FIG. 17 has been exaggerated for the sake of illustration.

It should apparent that the technique of using a ferromagnetic slider to couple relatively fixed driven and pick-up windings can be used with the laminated or slot-wound windings, and in such cases an electrostatic shield in the form of a grounded comb should be laminated or interlaid between the driven windings and the pick-up winding. The helical winding geometry, however, provides relatively high mutual inductance between the driven windings and the pick-up windings, and relatively low self-inductance, so that it functions most like a transformer, and returns a high signal level. The slot-wound geometry may return a high signal level but has appreciable self-inductance which may have to be cancelled out by selecting resonating capacitors for shunting the windings, but drift in the capacitance or self-inductance values causes a phase shift and therefore some loss in precision of position measurement. The laminated windings provide low self-inductance but also low mutual inductance, so high accuracy can be obtained, but relatively high drive current and a preamplifier near the position sensor may be required to obtain a sufficiently high signal to noise ratio for repeatable measurements within the high resolution of the digital phase sensing provided with the circuitry described below in connection with FIGS. 23 and 24.

Turning now to FIGS. 18 and 19 there is shown a rotary position sensor 140 employing the present invention. As is conventional, the sensor 140 has a control shaft 141 journaled to a mounting bushing 142 which is affixed to a disc-shaped plate 143. A cover 144 fits onto the plate 143.

To sense the angular position of the control shaft 141 with respect to the plate 143, a field member 145 formed of ferrite-loaded plastic is secured to the plate 143, and an armature member 147, also formed of ferrite-loaded plastic, abuts the field member and is secured to the control shaft. Multi-phase driven windings are provided on an annular-shaped multi-layer printed circuit board 146 mounted on the annular face of the field member 145. To give a phase-linear response over an entire 360 degrees of angular position, the driven windings should have an integral number of wavelengths per 360 degrees, for example, a first pair of driven windings have 16 wavelengths per 360 degrees, a second pair of driven windings has 12 wavelengths per 360 degrees, and a third pair of driven windings has 15 wavelengths per 360 degrees, corresponding to the example in FIG. 3. To sense the phase of the magnetic field provided by the driven windings at a selected angular position, the armature member is formed with grooves into which are wound pick-up windings 148 which abut the printed circuit board 146. The pick-up windings 148 are similar to the pick-up windings 50-52 of FIG. 8.

In order to convey the signal from the pick-up windings 148 to external lead wires 149, the pick-up windings are connected to an annular coil 150 formed in the armature member 147, and two of the lead wires 149 are connected to an annular coil 151 formed in the field member 145. The annular coils 150, 151 therefore form a rotary transformer. The other lead wires are connected to the driven windings in the printed circuit board 146.

There has now been described linear and rotary position sensors for generating electrical signals which provide respective offset pitch phase indications $C_1, C_2, \ldots C_M$ of displacement. In accordance with a feature of the present invention, the offset pitch phase indications are combined to form a position value by successively employing a procedure for justifying a high and low precision value and combining them. A specific procedure, named "PRECIS", is included in the program listing of Appendix I. The procedure is used as shown in FIG. 20. The indication $C_1$ approximately gives the least significant portion of the absolute position, $N_1$ times the difference $C_1-C_2$ gives the next least significant portion of the absolute position plus about $C_1$, and so on, and $N_1*N_2* \ldots *N_{M-1}$ times the difference $C_1-C_M$ gives approximately the absolute position. The various portions can be computed with precision by truncation, and then combined by multiplication and addition, but before truncation the fraction of the prior subtotal representing the less significant portions should be subtracted and one-half of the truncation quantization should be added. Therefore, the absolute position is given by:

$$C_1+N_1*TRUN(C_1-C_2-ST_1/N_1+HQ_1)+N_1*N_2 \\ *TRUN(C_1-C_3-ST_2/N_2+HQ_2)+\ldots \\ +N_1*N_2* \ldots \\ *N_{M-1}TRUN(C_1-C_M-ST_{M-1}+HQ_{M-1})$$

where $ST_1=C_1$, $ST_2=ST_1+N_1*TRUN(C_1-C_2-ST_1+HQ_1)$, etc. The procedure PRECIS in effect performs the elementary operation $L+N*TRUN(H-L/N+HQ)$.

Turning now to FIG. 21, there is shown a flowchart 160 of the PRECIS procedure implemented in binary arithmetic. It is assumed that the N's are powers of 2, such that $N=2^K$. In the first step 161 the operand L is left shifted right by K places to perform a division by N. Then in step 162, the left-shifted operand L is subtracted from H and a half-quantization value of 0 ... 010 ... 0 is added in order to compute $H-L/N+HQ$. In step 163 the sum is truncated by logically anding the sum with the mask 1 ... 100 ... 0. Finally, in step 164, the sum is logically or'ed with the left-shifted operand L, to obtain a left-justified value of $L+N*TRUN(H-L/N+HQ)$.

As an example, suppose $M=2$ so that there are two phase counts $C_1$ and $C_2$, and further assume that $C_1$ and $C_2$ are measured with eight bit precision, and the absolute position is 010001001101 binary. If the counts were entirely accurate, then one would measure $L=C_1=01001101$ and $H=C_1-C_2=01000101$. In step 161 the left-shifted value of L is 000001001101, and in step 162 the sum is computed as 010001000000−000001001101+000010000000=01001-0000011. In step 162 the sum is truncated to 010000000000 and in step 163 the sum becomes 010001001101 as it should be. However, even if the value of H were as high as 01001100 or as low as 00111101 the procedure would give the correct absolute position. Therefore, so long as the differences between the phase counts have four bit precision (i.e., an eight-bit count is precise to within +00000111 and −00001000 relative to the count $C_1$), then the absolute position can be resolved to within four additional bits by the sensing of an additional phase count.

Figure 22:
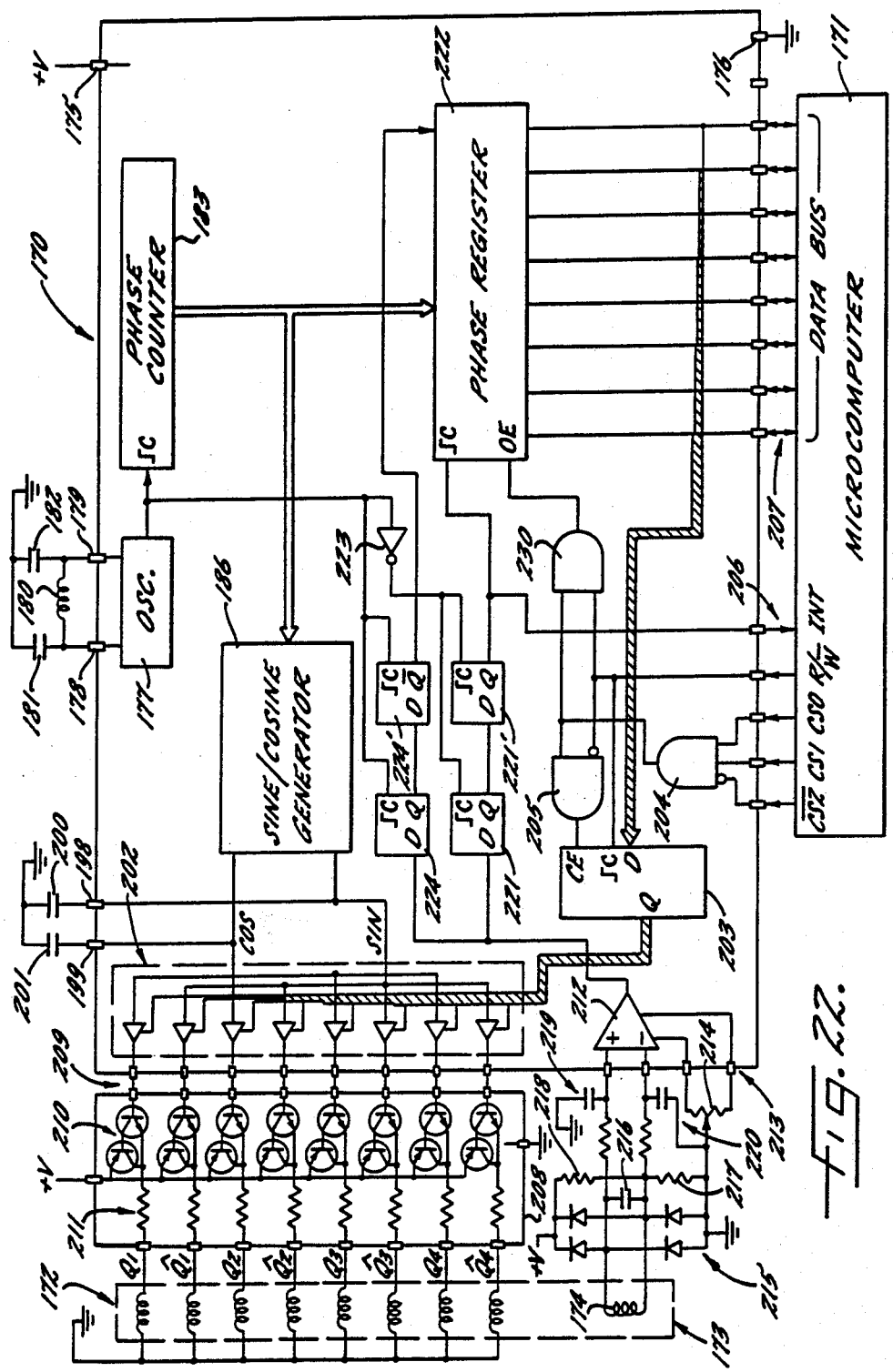
FIG. 22 is a block diagram of an integrated circuit for interfacing the absolute position sensors of the present invention to a microcomputer.

Turning now to FIG. 22, there is shown an integrated circuit 170 for use with a conventional microcomputer 171 for energizing the driven windings 172 of a position sensor 173 of the present invention and for processing the signal from a pick-up winding 174 to obtain phase counts. As shown, the integrated circuit 170 has 32 pins, and it is preferably fabricated using a CMOS process. Pin 175 receives a power supply voltage such as 5 volts, and pin 176 is a ground connection.

To provide a time base for generating quadrature-phase excitation signals for the driven windings 172 and for resolving the relative phase of the signal from the pick-up winding 174, the integrated circuit 170 includes an oscillator 177 having pins 178, 179 for connections to a resonator or tank circuit such as a quartz crystal, ceramic resonator, or as shown, an inductor 180 and capacitors 181 and 182. The oscillator 177 preferably oscillates at about 4 MHz or higher to provide quadrature-phase excitations signals at about 30 kHz or more. The excitation frequency is generated by a seven-stage synchronous binary counter 178.

In order to generate the quadrature-phase excitation signals, the output of the phase counter 183 is fed to a sine/cosine generator 186. The sine and cosine waveforms appear on pins 198, 199 which may be shunted to ground by capacitors 200, 201 in order to suppress switching harmonics and to cancel the effect of inductance in the driven windings 172 so that relatively undistorted sinusoidal waveforms appear across the driven windings.

In order to selectively energize the driven windings 172, the integrated circuit 170 includes respective transmission gates 202 which are enabled by respective signals from a latch 203. The integrated circuit 170 also includes a chip-select gate 204 to enable the microcomputer 171 to address the integrated circuit 170 and a latch-select gate 205 to enable the microcomputer to write to the latch 203 by asserting an address on chip-select and control pins 206 and by passing data over a bidirectional data bus to data bus pins 207.

To provide a sufficient amount of current for driving the driven windings 172 of the position sensor 173, a bipolar integrated circuit 208 is wired between the driven windings and output pins 209 for the transmission gates 202. The integrated circuit 209 includes respective super-beta transistors 210 in emitter follower configuration with respective current limiting resistors 211. To reduce leakage currents in the super-beta transistors 210, the transmission gates 202 should have NMOS devices for shunting the output pins 209 to ground when the transmission gates are off.

For receiving the signal from the pick-up winding 174, the integrated circuit includes a comparator 212 having signal and offset inputs on a set of pins 213. An optional potentiometer 214 may be used to adjust the offset of the comparator, for example, to provide a zero adjustment for the position sensor. Interconnected between the pick-up winding 174 and the comparator 212 is a circuit for biasing and protection from electrostatic discharge and electromagnetic pulse interference, including a bridge 215 of protection diodes clamping the leads of the pick-up windings to between ground and the supply voltage, a capacitor 216 resonating with the inductance of the pick-up coil, biasing resistors 217, 218, and resistor-capacitor lowpass filters 219, 220 protecting each of the inputs of the comparator 212 from high-speed pulses. If the position sensor 172 is mounted in close proximity to the integrated circuit 170, however, it may be unnecessary to use the diode bridge 215 or the resistor-capacitor filters 219, 220.

In order to sense the relative phase of the signal from the pick-up winding 174, the output of the comparator 212 is sampled by a delay flip-flop 221 and used to clock a latch receiving the phase count from the phase counter 183. A second flip-flop 221' is also used to guarantee a fast-rising clock to the latch 222 under all signal conditions. Therefore, the latch 222 functions as a phase register for indicating the phase of the signal from the pick-up winding 174. To eliminate a critical race condition, the delay flip-flops 221, 221' are clocked by an inverter 223 driven by the oscillator 177.

In order to provide increased phase resolution, the least significant bit of the phase count is provided by sampling the signal from the pick-up winding coincident with a clock transition of opposite polarity to the clock transition coincident with the sampling of the signal from the pick-up winding for the purpose of clocking the phase register 222. By employing this technique, the phase of the signal from the pick-up winding can be resolved with one extra bit of precision without requiring an increase in the frequency of the oscillator 177. In FIG. 22, the least significant bit of the phase count is provided by delay flip-flops 224, 224' clocked by the oscillator 177. Also in FIG. 22 the complement output of the flip-flop 224' is fed to the least significant data input of the phase register 222, and the data output of the flip-flop 221' is fed to the clock input of the phase register which is active upon a rising transition or edge from the flip-flop 221'.

To permit the microcomputer to address and read the phase count from the phase register 222, the phase register has tristate outputs which are connected to the data bus 207 and which are enabled by a gate 230 when the integrated circuit is addressed and the read/write signal is active for a read operation.

Figure 23:
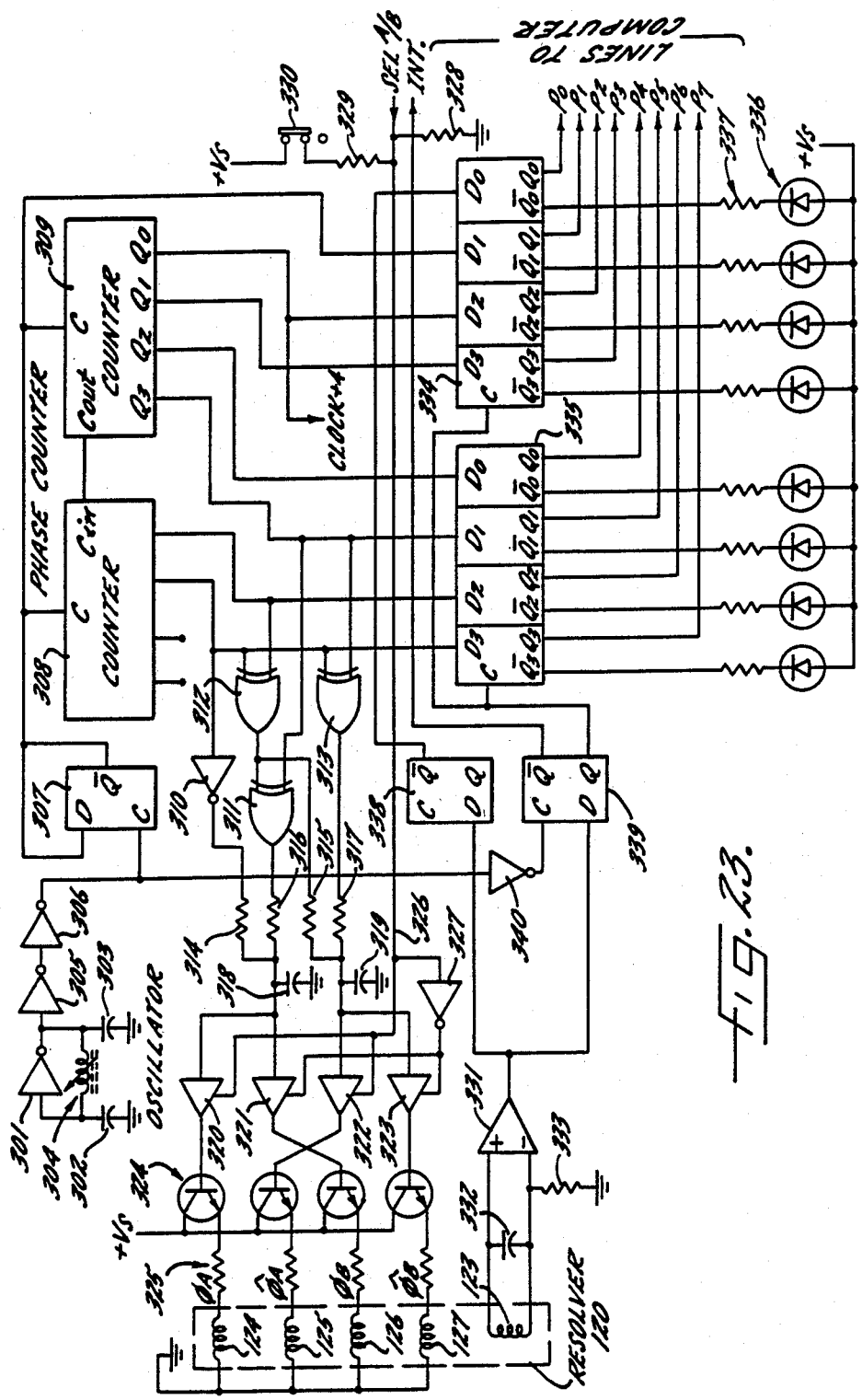
FIG. 23 is a schematic diagram of a circuit for interfacing the position sensor of FIGS. 14-16 to a microcomputer.

Turning now to FIG. 23 there is shown a schematic diagram of a circuit using individual 4000 series CMOS integrated circuits for demonstrating the feasibility of the integrated circuit 170 of FIG. 22 and for operation with a Motorola 6800 microprocessor programmed as shown in Appendix I. A 4 MHz oscillator is provided by an inverter 301, capacitors 302 and 303, an inductor 304. The inverter is, for example, part no. 4069, the capacitors are 120 picofarad, and the inductor is about 25 microhenries. The output of the inverter is buffered by inverters 305 and 306.

A phase counter includes a binary divider formed by a delay flip-flop 307 (part No. 4013) and 4-bit synchronous counters 308 and 309 (part No. 4029). A delay flip-flop is used because it can clock about twice as fast as a 4-bit synchronous counter (5 MHz for the 4013, but only about 2.5 MHz for the 4029). A quadrature-phase sine-cosine generator is provided by an inverter 310, exclusive-or gates 311, 312, 313 (part No. 4030), resistors 314, 315 (10K ohm), resistors 316, 317 (22K ohm), and capacitors 318, 319 (470 picofarads). The quadrature-phase signals are selectively directed through transmission gates 320, 321, 322, and 323 (part No. 4016). To drive the driven windings 124, 125, 126, 127 of the resolver 120 of FIG. 4, there are provided respective emitter follower circuits including NPN bipolar transistors 324 and resistors 325 (150 ohms). The windings 124, 125 are driven when a SEL A/B signal on line 326 is high, and otherwise an inverter 327 enables transmission gates 321 and 323 to drive the windings 126 and 127. To provide both manual as well as computer operation of the demonstration circuit, the line 326 is shunted to ground through a resistor 328 (100K ohms) and is selectively connectable to the power supply through a resistor 329 (4.7K ohms) and a switch 330. The switch is effective when the microcomputer is disconnected from the circuits in FIG. 23.

The signal from the pick-up winding 123 is fed to a comparator 331 (e.g. National Semiconductor part No. LM311, RCA Corp. CA311). The leads from the pick-up winding 123 are shunted with a capacitor 332 to resonate with the inductance of the pick-up winding at the operating frequency (for a 4 MHz clock, the operating frequency is 31.25 kHz and a typical capacitance value is 0.015 microfarad). A resistor 333 (22K ohms) biases the comparator inputs to ground.

Two quad D latches 334, 335 (part No. 74C175) provide a phase register. The phase register has true outputs which are fed to an input port ($P_0-P_7$) of the microcomputer, and complement outputs which drive an array 336 of light-emitting diodes connected via current-limiting resistors 337. The least significant input of the phase register is provided by a delay flip-flop 338 (part No. 4013). The phase register is clocked by the output of another delay flip-flop 339 (part no. 4013). An inverter 340 ensures that the two delay flip-flops 338, 339 are clocked alternately by the buffer inverter 306.

The program listing in Appendix I is executed to enable a Motorola 6800 microprocessor to operate the test circuit of FIG. 23. The computer program assumes that the I/O port $P_0-P_7$ is a Motorola 6820 PIA having a control A register at address F009 and corresponding data direction and I/O registers at address F008. The terminal CRA2 for the PIA is used to supply the SEL A/B signal to line 326 of FIG. 24, and the terminal CRA1 of the PIA is used to receive the complement output of the flip-flop 339 of FIG. 24 as an interrupt signal. Every time that a phase count $C_i$ is clocked into the phase register 334, 335, the microcomputer executes the interrupt procedure MIVEC beginning at address 0400. The interrupt procedure increments an interrupt counter (at address 0200) upon each interrupt. When the interrupt counter reaches a value of six, the count in the phase register 334, 335 is read and stored in memory (at address 0201) as the A phase count and then the SEL A/B signal is switched to select B. When the interrupt counter reaches a value of twelve (C hexadecimal), the interrupt counter is cleared, the count in the phase register is read and stored in memory (at address 0202) as the B phase count and the SEL A/B signal is switched back to select B. Therefore, the microcomputer periodically excites the A driven windings 124, 125, obtains the phase count $C_A$, excites the B driven windings, 126, 127, and obtains the phase count $C_B$.

In the executive program beginning at address 0400, the PIA is set up in a procedure named START. Then the absolute position is computed from the A and B phase counts which are stored and periodically updated in memory at addresses 0201 and 0202, respectively. In the procedure named COMPUTE the difference between the A and B phase counts is computed and stored as a two byte integer number in the memory locations 0204 and 0205 which store the SUM parameter for the PRECIS subroutine. The PRECIS subroutine is called to determine the absolute position, which ends up in the SUM memory locations 0204 and 0205. In a procedure named DISPLAY, the value of the absolute position is displayed by calling an internal subroutine residing in the microcomputer's operating system at address BDFF. Upon returning, execution jumps back to the COMPUTE procedure. In this way the absolute position of the core in the resolver 120 is continuously determined and indicated by the microcomputer.

In view of the above, there has been disclosed a method for enabling an "Inductosyn" type of variable phase transformer to sense absolute position. Also, for low-cost applications where the utmost in accuracy and precision is not required, there have been disclosed absolute position sensors for linear and rotary position sensing, and for providing high signal levels when driven with low excitation currents. The position sensors can be fabricated using either capital-intensive techniques as in the case of the laminated windings, or labor-intensive techniques as in the case of lap-wound and helical wound coils (although a numerically-controlled lathe could be used to wind the helical coils with a variably programmed pitch for obtaining a sinusoidal density along the length of the sensor for each driven winding). For use with any of the position sensors, there has also been provided an integrated circuit for interfacing to the data bus of a microcomputer.

APPENDIX I.

| Motorola MC6800 Program Listing | | | |
|---|---|---|---|
| 0200 | | INTERRUPT COUNTER | |
| 0201 | | PHASE A (4) Switch Top | |
| 0202 | | PHASE B (3) Switch Bottom | |
| 0203 | | SUM HIGH | |
| 0204 | | SUM LOW | |
| 0205 | | DIFFERENCE HIGH | |
| 0206 | | DIFFERENCE LOW | |
| 0400 | B6 | LDA A $0200 | MIVEC Rotine |
| 0401 | 02 | | |
| 0402 | 00 | | |
| 0403 | 4C | INC A | Increment Interrupt Counter |
| 0404 | B7 | | |
| 0405 | 02 | STA A $0200 | |
| 0406 | 00 | | |
| 0407 | 81 | CMP A $06 | |
| 0408 | 06 | | |
| 0409 | 26 | BNE SKIPA | |
| 040A | 0C | | |
| 040B | B6 | LDA A $F008 | |
| 040C | F0 | | |
| 040D | 08 | | |
| 040E | B7 | STA A $0201 | |
| 040F | 02 | | |
| 0410 | 01 | | |
| 0411 | 86 | LDA A #$37 | Select Phase B |
| 0412 | 37 | | |
| 0413 | B7 | STA A $F009 | |
| 0414 | F0 | | |
| 0415 | 09 | | |
| 0416 | 3B | RT1 | |
| 0417 | 81 | CMP A $0C | |
| 0418 | 0C | | |
| 0419 | 2C | BGE SKIPB | |
| 041A | 01 | | |
| 041B | 3B | RT1 | |
| 041C | 7F | CLR $0200 | SKIPB |
| 041D | 02 | | Reset Interrupt Counter |
| 041E | 00 | | |
| 041F | B6 | LDA A $F008 | Sample Phase B |
| 0420 | F0 | | |
| 0421 | 08 | | |
| 0422 | B7 | STA A $0202 | |
| 0423 | 02 | | |
| 0424 | 02 | | |
| 0425 | 86 | LDA A #$3F | Select Phase A |
| 0426 | 3F | | |
| 0427 | B7 | STA A $F009 | |
| 0428 | F0 | | |
| 0429 | 09 | | |
| 042A | 3B | RT1 | |
| 0440 | BD | JRS #FEID | START Executive Program |
| 0441 | FE | | |
| 0442 | 1D | | Clear Display |
| 0443 | 86 | LDA A #$3F | |
| 0444 | 3F | | |
| 0445 | B7 | STA A $F009 | Initialize PIA |

APPENDIX I.-continued
Motorola MC6800 Program Listing

| | | | |
|---|---|---|---|
| 0446 | F0 | | |
| 0447 | 09 | | |
| 0448 | 7F | CLR $0200 | Initialize Interrupt Counter |
| 0449 | 02 | | |
| 044A | 00 | | |
| 044B | 0E | CLI | Enable Interrupt |
| 044C | B6 | LDA A $0201 | COMPUTE Routine |
| 044D | 02 | | |
| 044E | 01 | | |
| 044F | 16 | TAB | |
| 0450 | F0 | SUB B $0202 | |
| 0451 | 02 | | |
| 0452 | 02 | | |
| 0453 | F7 | STA B $0205 | |
| 0454 | 02 | | |
| 0455 | 05 | | |
| 0456 | 7F | CLR $0206 | |
| 0457 | 02 | | |
| 0458 | 06 | | |
| 0459 | 80 | SUB A #$6C | |
| 045A | 6C | | |
| 045B | B7 | STA A $0203 | |
| 045C | 02 | | |
| 045D | 03 | | |
| 045E | 7F | CLR $0204 | |
| 045F | 02 | | |
| 0460 | 04 | | |
| 0461 | 8D | BSR PRECIS | |
| 0462 | 14 | | |
| 0463 | CE | LDX #$2600 | DISPLAY Routine |
| 0464 | 26 | | |
| 0465 | 00 | | Reset Display Pointer |
| 0466 | FF | STX #$0102 | |
| 0467 | 01 | | |
| 0468 | 02 | | |
| 0469 | B6 | LDA A | $0203 |
| 046A | 02 | | |
| 046B | 03 | | |
| 046C | BD | JSR DISPLAY | |
| 046D | FF | | |
| 046E | 6D | | |
| 046F | B6 | LDA A $0204 | |
| 0470 | 02 | | |
| 0471 | 04 | | |
| 0472 | BD | JSR DISPLAY | |
| 0473 | FF | | |
| 0474 | 6D | | |
| 0475 | 20 | BRA COMPUTE | |
| 0476 | D5 | | |
| 0477 | 74 | LSR $0203 | PRECIS Subroutine |
| 0478 | 02 | | |
| 0479 | 03 | | |
| 047A | 76 | ROR $0204 | |
| 047B | 02 | | |
| 047C | 04 | | |
| 047D | 74 | LSR $0203 | |
| 047E | 02 | | |
| 047F | 03 | | |
| 0480 | 76 | ROR $0204 | |
| 0481 | 02 | | |
| 0482 | 04 | | |
| 0483 | B6 | LDA A $0206 | |
| 0484 | 02 | | |
| 0485 | 04 | | |
| 0486 | B0 | SUB A $0204 | |
| 0487 | 02 | | |
| 0488 | 06 | | |
| 0489 | B6 | LDA A $0205 | |
| 048A | 02 | | |
| 048B | 05 | | |
| 049C | B2 | SUBC A $0205 | |
| 048D | 02 | | |
| 048E | 03 | | |
| 048F | 8B | ADD A #$20 | |
| 0490 | 20 | | |
| 0491 | 84 | AND A #$CO | |
| 0492 | C0 | | |
| 0493 | BA | ORA A $0203 | |
| 0494 | 02 | | |
| 0495 | 03 | | |
| 0496 | B7 | STA A $0203 | |
| 0497 | 02 | | |
| 0498 | 03 | | |
| 0499 | 39 | RTS | |

What is claimed is:

1. A method of sensing the position of a selected location over a certain range of locations along a predefined path, said method comprising the steps of:

(a) establishing an electromagnetic field along said path, said electromagnetic field alternating at a predetermined frequency but having a first phase that is a predetermined first periodic function of position within said range, said first periodic function having a predetermined first wavelength, said range extending over a distance of at least twice said first wavelength, such that said first phase varies continuously over two pi ($2\pi$) radians over a distance of said first wavelength in said range and said first phase is proportional to position in said range but said first phase has the same value at two different positions in said range which are spaced apart by a distance of said first wavelength, (b) sensing the phase of said electromagnetic field at said selected location to obtain a first phase indication, said first phase indication thereby being related to said position of said location according to said first periodic function, (c) changing said electromagnetic field along said path so that said electromagnetic field has a second phase that is a predetermined second periodic function of position within said range, said second periodic function having a predetermined second wavelength, said range extending over a distance of at least twice said second wavelength, such that said second phase varies continuously over two pi ($2\pi$) radians over a distance of said second wavelength in said range and said second phase is proportional to position in said range but said second phase has the same value at two different positions in said range which are spaced apart by a distance of said second wavelength, said first wavelength being different from said second wavelength so that every position within said range determines a unique combination of said first phase and said second phase but neither said first phase alone nor said second phase alone is sufficient to uniquely determine said position, (d) sensing the phase of the changed electromagnetic field at said selected location to obtain a second phase indication, said second phase indication thereby being related to the position of said location according to said second periodic function, and (e) computing said position of said location from said first and second phase indications.

2. The method as claimed in claim 1, wherein said electromagnetic field is established in step (a) by selectively driving a first pair of periodic conductive windings with respective in-phase and quadrature phase signals, each of said windings in said first pair having a pitch equal to said first wavelength, and the two windings in said first pair being mounted in positional phase quadrature with respect to each other, and said electromagnetic field is changed in step (c) by selectively driving a second pair of periodic conductive windings with respective in-phase and quadrature phase signals, each of said windings in said second pair having a pitch equal to said second wavelength, and the two windings in said second pair being mounted in positional phase quadrature with respect to each other.

3. A method of sensing the position of a selected location over a certain range of locations along a predefined path by using first and second sets of periodic electrical windings which extend over said range along said path and are inductively coupled at said selected location to a pick-up winding, said first set of periodic electrical windings having a predetermined first pitch and being capable of being energized by a plural-phase alternating signal to induce in said pick-up winding an alternating signal having a first phase that is a predetermined first periodic function of the position of said location over said range, said first periodic function having a first wavelength equal to said first pitch, said range extending over a distance of at least twice said first wavelength such that said first phase varies continuously over two pi ($2\pi$) radians over a distance of said first wavelength in said range and said first phase is proportional to the position of said location in said range but said first phase has the same value at two different positions within said range which are spaced apart by a distance of said first wavelength, said second set of periodic electrical windings having a predetermined second pitch and being capable of being energized by said plural-phase alternating signal to induce in said pick-up winding an alternating signal having a second phase that is a predetermined second periodic function of said position over said range, said second periodic function having a second wavelength equal to said second pitch, said range extending over a distance of at least twice said second wavelength such that said first phase varies continuously over two pi ($2\pi$) radians over a distance of said second wavelength in said range and said second phase is proportional to the position of said location in said range but said second phase has the same value at two different positions in said range which are spaced apart by a distance of said second wavelength, said second wavelength being different from said first wavelength so that every position within said range determines a unique combination of said first phase and said second phase but neither said first phase nor said second phase alone is sufficient to determine said position, said method comprising the steps of:
  (a) operating an electronic switch to energize said first set of periodic electrical windings with said plural-phase alternating signal, and measuring the phase of the electrical signal induced in the pick-up coil to obtain a first phase indication,
  (b) operating said electronic switch to energize said second set of periodic electrical windings with said plural-phase alternating signal, and measuring the phase of the electrical signal induced in the pick-up coil to obtain a second phase indication, and
  (c) computing said position of said location from said first and second phase indications.

4. A method of operating an inductive position sensor to sense position, said inductive position sensor comprising, in combination,
  a first support,
  a second support disposed in close proximity to said first support, said second support being relatively movable with respect to said first support along a direction,
  a first set of electrically conductive windings mounted on said first support,
  a second set of electrically conductive windings mounted on said first support,
  a third set of electrically conductive windings mounted on said second support,
  said second support being relatively moveable with respect to said first support along a predefined direction to align said third set of windings with locations within a predefined range of locations over said first support, said first set of windings being disposed in a first periodic spatial pattern extending along said direction over said range, said first periodic spatial pattern having a first pitch, said first periodic spatial pattern having multiple cycles over said range,
  said second set of windings being disposed in a second periodic spatial pattern extending along said direction over said range, said second periodic spatial pattern having a second pitch, said second periodic spatial pattern having multiple cycles over said range, said second pitch being substantially different from said first pitch, said first and second sets of windings being disposed in close proximity to each other and being registered with each other along said direction and over said range,
  said first set of windings being connectable to one of a plural-phase source of alternating current and a phase discriminator, and said third set of windings being connectable to the other of said plural-phase source of alternating current and said phase discriminator, when said second set of windings is disconnected, to provide a first phase indication that is proportional to displacement of said second support with respect to said first support along said direction and over said range, said first phase indication being a first periodic function of said displacement that varies continuously over at least two pi ($2\pi$) radians, values of said displacement differing by approximately said first pitch giving rise to the same values of said first phase indication,
  said second set of windings being connectable to said one of said plural-phase source of alternating current and said phase discriminator, and said third set of windings being connectable to said other of said plural-phase source of alternating current and said phase discriminator, when said first set of windings is disconnected, to provide a second phase indication that is proportional to displacement of said second support with respect to said first support along said direction and over said range, said second phase indication being a second periodic function of said displacement that varies continuously over at least two pi ($2\pi$) radians, values of said displacement differing by approximately said second pitch giving rise to the same values of said second phase indication, whereby said displacement is determinable from said first and second phase indications,
  said method comprising the steps of:
  (a) connecting said one of said plural-phase source of alternating current and said phase discriminator to said first set of windings and connecting said other of said plural-phase source of alternating current and said phase discriminator to said third set of windings and obtaining with said phase discriminator said first phase indication that is proportional to displacement of said second support with respect to said first support along said direction and over said range;

(b) disconnecting said one of said plural-phase source of alternating current and said phase discriminator from said first set of windings and connecting said one of said plural-phase source of alternating current and said phase discriminator to said second set of windings, and obtaining with said phase discriminator said second phase indication that is proportional to displacement of said second support with respect to said first support along said direction and over said range; and (c) computing the value of said displacement from said first and second phase indications.

5. The method of operating an inductive position sensor to sense position as claimed in claim 4, wherein said first and second phase indications are linear functions of said displacement.

6. The method of operating an inductive position sensor to sense position as claimed in claim 4, wherein said first periodic function includes a plurality of N cycles of said first wavelength over said range, and said second periodic function includes a plurality of N−1 cycles of said second wavelength over said range.

7. The method of operating an inductive position sensor to sense position as claimed in claim 4, wherein said step (c) of computing the value of said displacement includes the steps of:

(c1) computing the difference between said first and second phase indications, said difference indicating approximately the value of said displacement, and (c2) adjusting said difference based upon at least one of said first and second phase indication to obtain an adjusted difference having an increased relative precision.

8. The method of operating an inductive position sensor to sense position as claimed in claim 7, wherein said step (c2) of adjusting said difference to obtain an adjusted difference having an increased relative precision includes the steps of:

(c2A) relatively justifying said difference with respect to said first phase indication so that said difference represents an increased absolute value relative to said first phase indication, and (c2B) combining the justified difference with said first phase indication so that the combination has the increased relative precision of said first phase indication.

9. The method of operating an inductive position sensor to sense position as claimed in claim 8, wherein said step (c2B) of combining the justified difference with said first phase indication includes the steps of computing the difference between the justified difference and the first phase indication, adding half the range of the first phase indication, truncating the full range of the first phase indication, and then adding the first phase indication.

10. The method of operating an inductive position sensor to sense position as claimed in claim 9, wherein said first plurality of cycles is an integral power of two, said second plurality of cycles is one less that said first plurality of cycles, said step (c2A) of relatively justifying is performed by a binary shift operation, and said truncating is performed by a logical masking operation.

11. The method of operating an inductive position sensor to sense position as claimed in claim 4, wherein said steps (a), (b), and (c) are performed by a microcomputer, and said microcomputer operates an analog multiplexer to select said first set of windings in step (a) and said second set of windings in step (b).

12. The method of operating an inductive position sensor to sense position as claimed in claim 4, wherein said phase discriminator in steps (a) and (b) measures the phase of an analog signal which is electrically connected via an analog multiplexer to said first periodic windings in step (a) and to said second periodic windings in step (b).

13. The method of operating an inductive position sensor to sense position as claimed in claim 4, wherein said third set of periodic windings has a single winding.

14. The method of operating an inductive position sensor to sense position as claimed in claim 13, wherein said first set of windings is connected to a first set of terminals and said second set of windings is connected to a second set of terminals, and wherein said steps (a) and (b) of obtaining said first and second phase indications are performed by operating an electronic switch selecting the first set of terminals for obtaining said first phase indication and selecting said second set of terminals for obtaining said second phase indication.

15. The method of operating an inductive position sensor to sense position as claimed in claim 14, wherein said first and second sets of windings are selectively energized through said electronic switch.

16. The method of operating an inductive position sensor to sense position as claimed in claim 15, wherein each of said first and second sets of windings are selectively energized with a pair of sinusoidal signals in phase quadrature relation to each other, and said sinusoidal signals pass through said electronic switch.

17. The method of operating an inductive position sensor to sense position as claimed in claim 4, wherein said first and second sets of windings are driven windings, and said third set of windings picks up a signal having a phase providing said first and second phase indications.

* * * * *